(12) United States Patent
Agar

(10) Patent No.: US 9,300,263 B2
(45) Date of Patent: Mar. 29, 2016

(54) APPARATUS AND METHOD PERTAINING TO VOLUME CONTROL

(75) Inventor: John Michael Agar, Kitchener (CA)

(73) Assignee: BlackBerry Limited, Waterloo, Ontario (CA)

(*) Notice: Subject to any disclaimer, the term of this patent is extended or adjusted under 35 U.S.C. 154(b) by 817 days.

(21) Appl. No.: 13/456,631

(22) Filed: Apr. 26, 2012

(65) Prior Publication Data

US 2013/0287230 A1 Oct. 31, 2013

(51) Int. Cl.
*H03G 3/00* (2006.01)
*H03G 3/02* (2006.01)
*H03G 3/30* (2006.01)

(52) U.S. Cl.
CPC .............. *H03G 3/02* (2013.01); *H03G 3/3005* (2013.01); *H03G 3/3089* (2013.01)

(58) Field of Classification Search
None
See application file for complete search history.

(56) References Cited

U.S. PATENT DOCUMENTS

| | | | |
|---|---|---|---|
| 2007/0291955 A1 | 12/2007 | Yamashita et al. | |
| 2008/0031470 A1* | 2/2008 | Angelhag | 381/77 |
| 2009/0323985 A1* | 12/2009 | Garudadri et al. | 381/104 |
| 2010/0185307 A1 | 7/2010 | Matsushita | |
| 2010/0217412 A1* | 8/2010 | Abraham | 700/94 |
| 2011/0051959 A1* | 3/2011 | Ito et al. | 381/107 |
| 2012/0051560 A1* | 3/2012 | Sanders | 381/105 |

FOREIGN PATENT DOCUMENTS

EP 2426955 A1 3/2012

OTHER PUBLICATIONS

Stein, Scott. "How to connect your iPad/iPhone to Bluetooth speakers." CNET, Jul. 22, 2010. Web. <http://www.cnet.com/how-to/how-to-connect-your-ipadiphone-to-bluetooth-speakers/>.*
"SoundLink Wireles Mobile Speaker Owners Guide." Bose. Web.*
"Bose Soundlink Bluetooth Wireless Speaker." Amazon. Sep. 19, 2011. Web.*
Fritzsche, H., Examiner; Extended European Search Report from related European Patent Application No. 12165815.7 dated Sep. 10, 2012; 4 pages.

* cited by examiner

*Primary Examiner* — Joseph Saunders, Jr.
*Assistant Examiner* — James Mooney
(74) *Attorney, Agent, or Firm* — Thomas Grzeski; Fleit Gibbons Gutman Bongini & Bianco P.L.

(57) ABSTRACT

An apparatus comprises a volume-control user interface, a transmitter, an audio amplifier (having a corresponding amplification range), and a control circuit operably coupled to the foregoing components. This control circuit is configured to respond to a volume change made via the volume-control user interface that is within the amplification range of the audio amplifier by making a corresponding change to a volume level for an audio signal being transmitted by the transmitter. The control circuit is also configured to respond to a volume change made via the volume-control user interface that exceeds the amplification range of the audio amplifier by transmitting a volume-increase command.

14 Claims, 4 Drawing Sheets

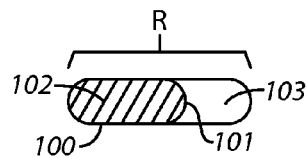
FIG. 1
*Prior Art*
FIG. 2
*Prior Art*
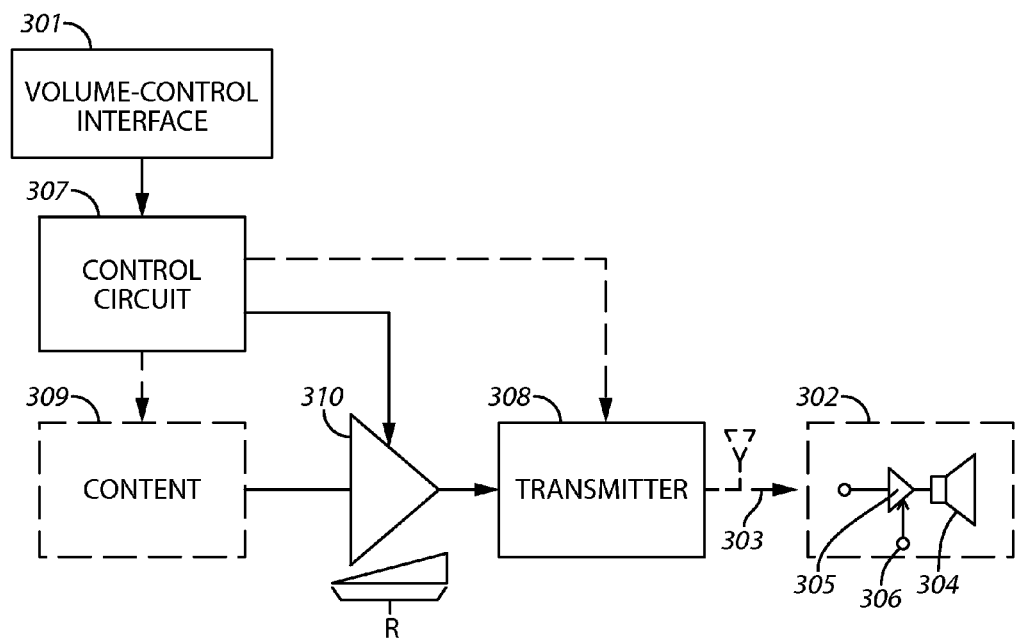
FIG. 3

APPARATUS AND METHOD PERTAINING TO VOLUME CONTROL

FIELD OF TECHNOLOGY

The present disclosure relates to electronic devices, including but not limited to portable electronic devices having audio rendering capabilities.

BACKGROUND

Electronic devices, including portable electronic devices, have gained widespread use and may provide a variety of functions. This can include providing audio content to a secondary platform for audible rendering. As one simple example in these regards, a so-called smartphone may wirelessly transmit audio content to an earpiece that the latter renders audible for a user. As another simple example, a given device such as a smartphone or tablet-based device may provide video and audio content via a high-definition multimedia interface (HDMI) cable to a platform that renders such content perceptible to a user.

Controlling audio levels comprises an area of known endeavor. In many such cases a user interface permits a user to select or otherwise vary a present volume setting. Generally speaking, there are two main types of user interfaces in these regards. An absolute volume control typically allows a user to select a particular volume level within a user-perceptible volume-control range. A typical slider-based interface or rotating potentiometer comprise common examples in these regards. A relative volume control, on the other hand, permits a user to specify increasing or decreasing the volume without a specific provided reference to a present volume level within a given range of available levels. A pair of up/down volume buttons that increment volume louder or quieter, respectively, are a common example in these regards.

As noted above, sometimes a user will source audio content from one device and render that content audible using a second device. Unfortunately, confusion and difficulty can occur when mismatches exist regarding volume control modalities between such platforms. For example, the user may be uncertain regarding how (or may even be technically unable) to adequately or fully control the audio volume when the sourcing platform uses an absolute volume control modality while the rendering platform uses a relative volume control modality.

BRIEF DESCRIPTION OF THE DRAWINGS

FIG. 1 is a schematic representation in accordance with the prior art.

FIG. 2 is a schematic representation in accordance with the prior art.

FIG. 3 is a block diagram in accordance with the disclosure.

DETAILED DESCRIPTION

Figure 4:
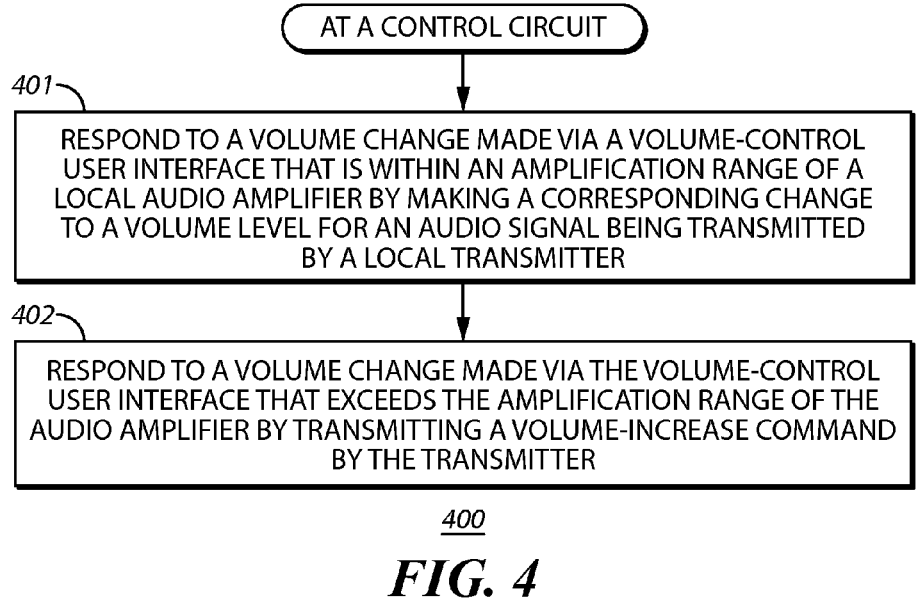
FIG. 4 is a flow diagram in accordance with the disclosure.

The following describes an apparatus and method pertaining to controlling audio volume. A corresponding apparatus can comprise, for example, a volume-control user interface, a transmitter, an audio amplifier (having a corresponding amplification range), and a control circuit operably coupled to the foregoing components. This control circuit can be configured to respond to a volume change made via the volume-control user interface that is within the amplification range of the audio amplifier by making a corresponding change to a volume level for an audio signal being transmitted by the transmitter. The control circuit can also be configured to respond to a volume change made via the volume-control user interface that exceeds the amplification range of the audio amplifier by transmitting a volume-increase command by the transmitter.

By one approach the volume-control user interface can have an absolute volume control modality and can comprise, for example, a depiction of a slider (via, for example, a touch-sensitive display). So configured, this volume-control user interface can visually represent the amplification range of the audio amplifier (which may comprise, by one approach, a permitted, recommended, and/or desired amplification range as versus a technically-feasible amplification range).

The aforementioned volume-increase command can comprise, by one approach, an instruction to make an incremental increase in volume by some predetermined amount. This might comprise a single technically-smallest-possible increment or, if desired, a specific plurality of such incremental amounts.

So configured, an audio-sourcing platform having an absolute audio volume control modality can be successfully and intuitively employed in conjunction with an audio-rendering platform that employs a relative audio volume control modality. These teachings are relatively inexpensive to deploy and apply and are highly scalable in practice. These teachings are also highly flexible and will accommodate all manner of absolute and relative approaches to volume control.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

Before describing the present concepts in detail it may be helpful to first briefly remind the reader of at least some differences between absolute volume control and relative volume control user interfaces. FIG. 1 illustrates one example of a prior art absolute volume control having the form factor of a slider 100. This slider 100 may be provided, for example, on a touch-sensitive display to permit a user to interact with the slider 100.

Such a slider 100 may or may not include bounding values for its range (here, such values are not shown) but in any event such a user interface inherently and intuitively suggests to the viewer a corresponding audio volume range "R" that corresponds to the length of the slider 100. A presently-selected volume level 101 and the location of that level 101 within that range "R" is easily and intuitively discerned by the viewer. In addition, to ease quickly locating that presently-selected volume level 101 a portion 102 of the slider 100 to the left of that level 101 is colored (or otherwise highlighted or visually differentiated) from the remaining portion 103 of the slider 100 that appears to the right of the presently-selected volume level 101. So configured, the user can see the presently-selected volume level 101 and can also understand, generally, how much louder, or quieter, the volume can be set.

FIG. 2, on the other hand, illustrates an example of a prior art relative volume control user interface 200. This relative volume control user interface 200 comprises a first upwardly-pointing arrowhead 201 and an opposing downwardly-pointing arrowhead 202. So configured, the user can see and intuitively understand that asserting the upwardly-pointing arrowhead 201 will increase the volume while asserting the downwardly-pointing arrowhead 202 will decrease the volume (at least to the extant that the volume can, in fact, be further adjusted in such directions). Such a user interface 200, however, gives the user no visual cue or clue as to what the presently-selected audio volume is with respect to an available amplification range.

Referring now to FIG. 3, an illustrative apparatus 300 includes a volume control interface 301 that comprises an absolute volume control such as, but not limited to, the slider 100 described above. The present teachings permit a user to employ this absolute volume control when controlling the volume of audio as rendered by a secondary platform 302 to which the apparatus 300 conveys an audio signal 303. In this illustrative example the secondary platform 302 includes an audio transducer 304 (such as one or more speakers, a headphone jack, and so forth) and a corresponding audio amplifier 305. Also for the sake of this illustrative example this secondary platform 302 utilizes a relative volume control 306 to control the amplification of the audio amplifier 305 (such as, but not limited to, the relative volume control user interface 200 described above). (As used herein, this reference to a platform that is "secondary" will be understood to refer to a platform that is physically distinct and discrete with respect to the apparatus 300 (although the two may be tethered to one another by, for example, an optical cable or an electrically-conductive wire or wires).)

This apparatus 300 also includes a control circuit 307 that is operably coupled to and responds to the volume-control interface 301 and that also operably couples to a transmitter 308 that transmits the aforementioned audio signal 303. By one approach this transmitter 308 can comprise a wireless transmitter. For the sake of an illustrative example, it will be presumed here that the transmitter 308 comprises a non-wireless transmitter that transmits the audio signal 303 via, for example, an HDMI cable that connects the apparatus 300 to the secondary platform 302. It will, however, be appreciated by those skilled in the art that the apparatus 300 and secondary platform 302 may communicate over wireless links such as, for example, Bluetooth or other dedicated Short Range Communications, WiFi, and the like.

In this illustrative example the transmitted audio signal 303 begins with content 309 that may be locally stored or that is provided from a remote source (such as an audio-visual streaming service of choice). The audio content passes through an audio amplifier 310 that operably couples to, and is controlled by, the control circuit 307. So configured, the control circuit 307 can control the gain of the audio amplifier 310 over the amplification range "R" of that audio amplifier 310. (In cases where the content 309 comprises both audio and video content, it will be understood that the control circuit 307 and the transmitter 308 may further serve to transmit the corresponding video content along with the audio signal 303. For the sake of clarity and simplicity, however, details in those regards are not provided here.)

Generally speaking, per the present teachings, the control circuit 307 serves to select a particular pre-transmission amplification level for the audio amplifier 310. The control circuit 307 is also configured, however, to have the transmitter 308 transmit a volume-increase command to the secondary platform 302. The latter can comprise, for example, a remote-control signal that the secondary platform 302 recognizes as an instruction to increment the local audio volume level by some given amount.

More particularly, and referring now to FIG. 4, the control circuit 307 can be configured (via, for example, corresponding programming as will be well understood by those skilled in the art) to carry out a process 400 that provides for responding 401 to a volume change made via the volume-control user interface 301 that is within the amplification range "R" of the local audio amplifier 310 by making a corresponding change to the volume level of the audio signal 303 being transmitted by the local transmitter 308.

Figure 5:
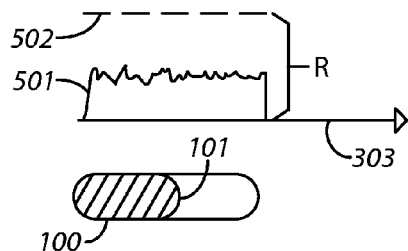
FIG. 5 is a schematic representation in accordance with the disclosure.

FIG. 5 provides an illustrative example in these regards. In this example, the slider 100 that comprises the volume-control interface 301 has its present volume level 101 set about half way in the available amplification range "R." As a result, the audio content 501 of the transmitted audio signal 303 only consumes about half of the available local volume-level headroom 502.

Figure 6:
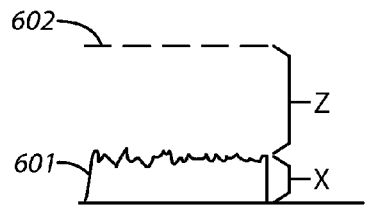
FIG. 6 is a schematic representation in accordance with the disclosure.

FIG. 6, in turn, depicts the resultant received and rendered audio signal 601 at the secondary platform 302. This figure generally illustrates that the secondary platform 302 has an amplification range 602 that is presently unused by a headroom amount represented by "Z." (Although these illustrations might suggest an analog transmission of the audio content 501, it will be understood that the analog-like representation serves in an illustrative purpose and that these teachings will readily also accommodate the digital transmission of such content and that the transmitted audio signal described herein can comprise audio content that is encoded, digitized, or otherwise represented using essentially any approach in these regards.)

Figure 7:
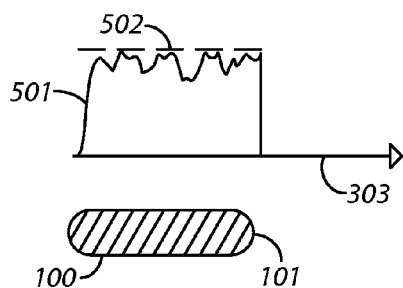
FIG. 7 is a schematic representation in accordance with the disclosure.
Figure 8:
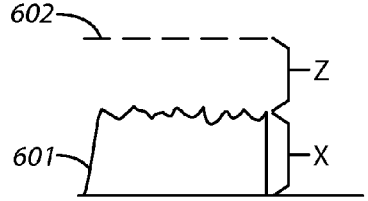
FIG. 8 is a schematic representation in accordance with the disclosure.

Referring now to FIGS. 7 and 8, here the user has interacted with the slider 100 to set the volume level 101 to the maximum amount provided and represented by that slider 100. As shown in FIG. 7 the audio content 501 has a corresponding volume level that utilizes the entire available headroom 502 and hence that utilizes the entire locally-available amplification range "R." This does not necessarily mean, however, that the secondary platform is also without further gain headroom. Instead, as shown in FIG. 8, the locally-rendered audio signal 601 still has available local headroom "Z." This situation reflects that the local amplifier 305 for the secondary platform 302 is only running at about half power or so. Accordingly, it is still possible for the rendered audio signal 601 to be further amplified notwithstanding that the apparatus's slider 100 appears to be set at a maximum level.

Referring again to FIG. 4, this process 400 also provides for responding 402 to a volume change made via the apparatus's volume-control user interface 301 that exceeds the amplification range "R" of the local audio amplifier 310 by transmitting a volume-increase command via the local transmitter 308. If desired, the control circuit 307 can indicate this available opportunity by appropriately modifying the presentation of the volume-control user interface 301.

Figure 9:
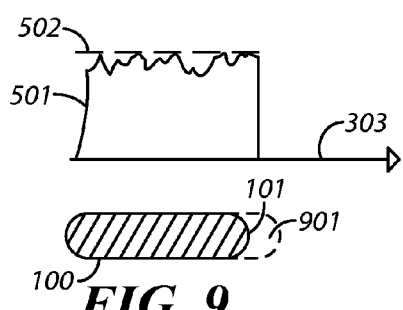
FIG. 9 is a schematic representation in accordance with the disclosure.

As shown in FIG. 9, by one simple approach this can comprise adding a small additional portion 901 to the slider 100 to indicate this opportunity to at least attempt to increase the rendered audio volume. If desired, this small additional portion 901 can have a different appearance from the usual presentation of the slider 100. As one simple example in these regards, the slider 100 might use a dark green color to illustrate a selected volume level and a light green color to illustrate available local headroom and then utilize a red color to indicate this opportunity to potentially further increase the volume beyond the available local range "R" of amplification.

Figure 10:
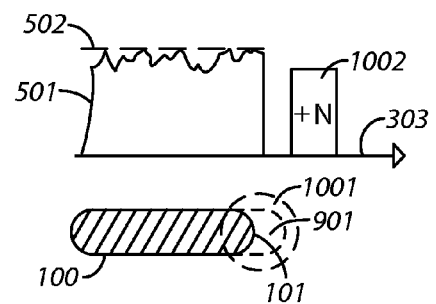
FIG. 10 is a schematic representation in accordance with the disclosure.

In any event, whether one provides a visual cue or not, the control circuit 307 detects a user's effort to further increase the rendered audio volume via the volume-control interface 301 and responds by now causing the transmitter 308 to issue a volume-increase command. As illustrated in FIG. 10, the control circuit 307 may detect, for example, a user's finger pressure 1001 in the aforementioned additional portion 901 of the slider 100. This, in turn, causes the audio signal 303 to now include, in addition to the audio content 501 itself, the volume-increase command 1002.

The specifics of the volume-increase command 1002 can correspond, for example, to the protocol expectations of the secondary platform 302. Those skilled in the art will be well familiar with the requirements of various protocols in these regards. As the present teachings are not overly sensitive to any particular choices in these regards, further elaboration with respect to the form of the volume-increase command 1002 are not provided here.

This volume-increase command 1002 can comprise, for example, a command that represents a one-step incremental increase in volume as corresponds to the relative volume control modality of the secondary platform 302. These teachings will accommodate other approaches in these regards, however. As a result, this volume-increase command 1002 can represent an N-step incremental increase in volume as desired (where "N" is any integer of choice).

Figure 11:
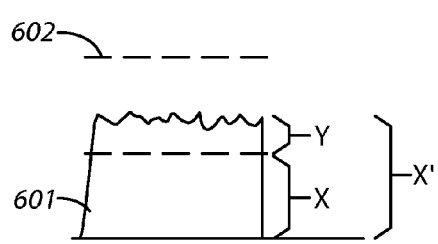
FIG. 11 is a schematic representation in accordance with the disclosure.

Referring to FIG. 11, the audio amplifier 305 of the secondary platform 302 responds to that volume-increase command 1002 by increasing its own gain to thereby increase the rendered audio volume 600 beyond the previous volume level "X" by a value denoted here at "Y." These actions, in turn, now establish a new maximum value X' in that further manipulations of the slider 100 within the bounds of its apparent range R will result in volume levels within that range X'.

Figure 12:
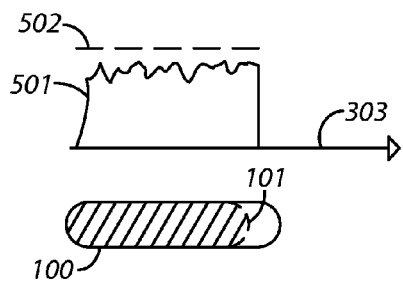
FIG. 12 is a schematic representation in accordance with the disclosure.
Figure 13:
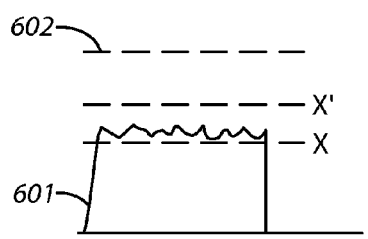
FIG. 13 is a schematic representation in accordance with the disclosure.

For example, and as illustrated in FIGS. 12 and 13, if the user now manipulates the slider 100 to reduce the present volume level 101, this will reduce local amplification of the transmitted audio content 501 and this, in turn, will result in a diminution of the rendered audio volume 601 at the secondary platform 302 as shown in FIG. 13. In this particular illustrative example, the new rendered audio volume 601 is less than the new maximum value X' but still greater than the previous maximum value X.

The user can of course manipulate the slider 100 to reduce the volume level to an absolute minimum. By one approach, the control circuit 307 need not be configured to respond to further attempts to further reduce the volume by similarly transmitting a volume-decrease command as such a command will generally likely serve no useful purpose. Accordingly, for many application settings it will be satisfactory if the control circuit 307 is not configured to ever transmit a volume-decrease command by the transmitter 308 when also transmitting the audio signal 303.

It will be appreciated that the foregoing examples could be repeated, with corresponding continued increases in local amplification at the secondary platform 302, until the audio amplifier 305 at the secondary platform 302 also reaches its maximum amplification level 602. In such a case, the control circuit 307 may continue to transmit volume-increase commands 1002 in response to indications from the user that the volume be further increased, but these volume-increase commands 1002 will not yield corresponding increases in volume when the amplification capabilities of the secondary platform 302 are already set to a peak level.

Figure 14:
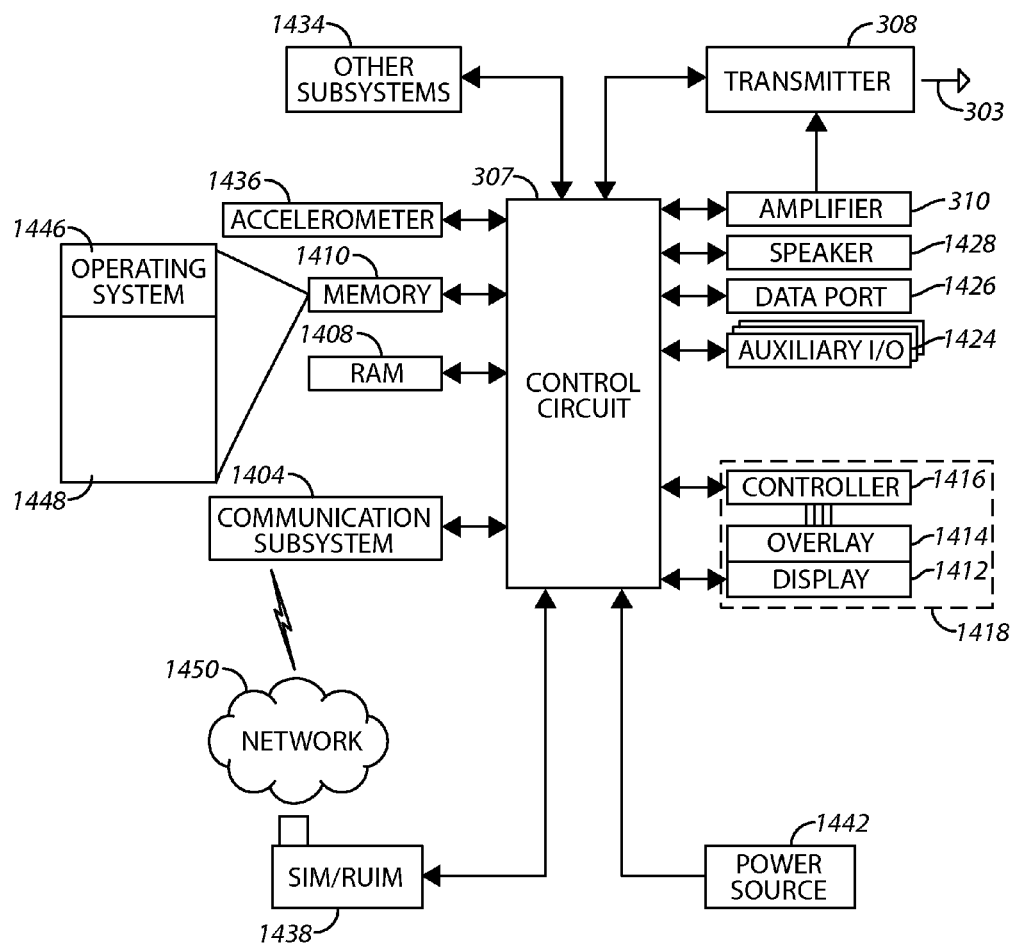
FIG. 14 is a block diagram in accordance with the disclosure.

These teachings can be carried out in conjunction with a wide variety of apparatuses and secondary platforms. By one approach, for example, the apparatus 300 comprises a portable electronics device such as a so-called smartphone. With reference to FIG. 14, an exemplary portable electronic device includes a control circuit 307 that controls the overall operation of the portable electronic device. Communication functions, including data and voice communications, are performed through a communication subsystem 1404. The communication subsystem receives messages from and sends messages to a wireless network 1450. The wireless network 1450 may be any type of wireless network, including, but not limited to, data wireless networks, voice wireless networks, and networks that support both voice and data communications. By one approach this communications subsystem 1404 also provides the point of entry for the aforementioned audio (or video-audio) content 309.

A power source 1442, such as one or more rechargeable batteries or a port to an external power supply, powers the electronic device.

The control circuit 307 interacts with other elements, such as Random Access Memory (RAM) 1408, a primary memory 1410, a display 1412 with a touch-sensitive overlay 1414 operably coupled to an electronic controller 1416 that together comprise an optional touch-sensitive display 1418, an auxiliary input/output (I/O) subsystem 1424, a data port 1426, a speaker 1428, the aforementioned audio amplifier 310, the aforementioned transmitter 308 that transmits the audio signal 303, and other device subsystems 1434 of choice.

One or more user interfaces are provided. The aforementioned absolute volume control interface 301 can be provided via a graphical user interface that is provided via the touch-sensitive overlay 1414. The control circuit 307 interacts with the touch-sensitive overlay 1414 via the electronic controller 1416. Information, such as text, characters, symbols, images, icons, and other items can also be displayed on the touch-sensitive display 1418 via the control circuit 307.

The touch-sensitive display 1418 may be any suitable touch-sensitive display, such as a capacitive, resistive, infrared, surface acoustic wave (SAW) touch-sensitive display, strain gauge, optical imaging, dispersive signal technology, acoustic pulse recognition, and so forth, as known in the art. A capacitive touch-sensitive display includes a capacitive touch-sensitive overlay 1414. The overlay 1414 may be an assembly of multiple layers in a stack including, for example, a substrate, a ground shield layer, a barrier layer, one or more capacitive touch sensor layers separated by a substrate or other barrier, and a cover. The capacitive touch sensor layers may comprise any suitable material, such as indium tin oxide (ITO).

In this illustrative example the control circuit 307 may interact with an accelerometer 1436 that may be utilized to detect direction of gravitational forces or gravity-induced reaction forces.

To identify a subscriber for network access, the portable electronic device may utilize a Subscriber Identity Module or a Removable User Identity Module (SIM/RUIM) card 1438 for communication with a network, such as the wireless network 1450. Alternatively, user identification information may be programmed into the memory 1410.

The portable electronic device includes an operating system 1446 and software programs (such as but not limited to programming that causes the control circuit 307 to carry out the actions described herein), applications, or components 1448 that are executed by the control circuit 307 can stored in a persistent, updatable store such as the memory 1410. Additional applications or programs may be loaded onto the portable electronic device through the wireless network 1450, the auxiliary I/O subsystem 1424, the data port 1426, or any other suitable subsystem 1434 (such as a short-range wireless communications interface). The memory 1410 may comprise a non-transitory storage media that stores executable code, when executed, causes one or more of functions or actions as described herein.

So configured, a portable electronic device having an absolute volume control interface modality can readily and successfully interact with a secondary device that utilizes a relative volume control modality in a manner that is simple, effective, and intuitive for the user. These teachings can be successfully employed with a wide variety of apparatuses and hence can serve to greatly leverage the continued viability and utility of existing designs and platforms. The concepts described herein are also highly scalable in practice and will accommodate a wide variety of signaling types and protocols, amplifier types, amplification ranges, specific user interfaces, and so forth.

The present disclosure may be embodied in other specific forms without departing from its essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

I claim:

1. An apparatus comprising:
a volume-control user interface;
a transmitter;
an audio amplifier having a corresponding amplification range; and
a control circuit operably coupled to the volume-control user interface, the transmitter, and the audio amplifier and being configured to:
receive a volume change made via the volume-control user interface;
determine that the volume change
is within the amplification range of the audio amplifier or
exceeds the amplification range of the audio amplifier
responsive to the volume change being within the amplification range of the audio amplifier, making a corresponding change to a volume level for an audio signal being transmitted by the transmitter; and
responsive to the volume change exceeding the amplification range of the audio amplifier, transmitting a volume-increase command by the transmitter.

2. The apparatus of claim 1 wherein the apparatus comprises a portable communications device.

3. The apparatus of claim 1 wherein the transmitter comprises a non-wireless transmitter.

4. The apparatus of claim 1 wherein the volume-control user interface comprises a depiction of a slider on a touch-sensitive display.

5. The apparatus of claim 1 wherein the volume-control user interface visually represents the amplification range.

6. The apparatus of claim 1 wherein the control circuit is configured to never transmit a volume-decrease command by the transmitter while also transmitting the audio signal.

7. The apparatus of claim 1 wherein the audio signal comprises a part of an audio-video signal.

8. The apparatus of claim 1 wherein the volume-increase command represents a one-step incremental increase in volume.

9. A method comprising:
at a control circuit:
receiving a volume change made via a volume-control user interface;
determining that the volume change
is within the amplification range of a local audio amplifier or
exceeds the amplification range of the local audio amplifier;
responsive to the volume change being within an amplification range of a local audio amplifier, making a corresponding change to a volume level for an audio signal being transmitted by a local transmitter; and
responsive to the volume change exceeding the amplification range of the audio amplifier, transmitting a volume-increase command by the transmitter.

10. The method of claim 9 wherein the transmitter comprises a non-wireless transmitter.

11. The method of claim 9 wherein the volume-control user interface comprises a depiction of a slider on a touch-sensitive display.

12. The method of claim 9 wherein the volume-control user interface visually represents the amplification range.

13. The method of claim 9 wherein the audio signal comprises a part of an audio-video signal.

14. The method of claim 9 wherein the volume-increase command represents a one-step incremental increase in volume.

* * * * *